US012787561B2

(12) United States Patent
Shim et al.

(10) Patent No.: US 12,787,561 B2
(45) Date of Patent: Nov. 3, 2026

(54) DISPLAY DEVICE

(71) Applicant: LG Display Co., Ltd., Seoul (KR)

(72) Inventors: Sungbin Shim, Yangsan-si (KR); Dahye Kwon, Seoul (KR); SangWon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 359 days.

(21) Appl. No.: 18/733,469

(22) Filed: Jun. 4, 2024

(65) Prior Publication Data

US 2024/0423029 A1 Dec. 19, 2024

(30) Foreign Application Priority Data

Jun. 14, 2023 (KR) ........................ 10-2023-0075912

(51) Int. Cl.
*H10K 59/122* (2023.01)
*H10K 59/35* (2023.01)
*H10K 59/80* (2023.01)

(52) U.S. Cl.
CPC ..... *H10K 59/122* (2023.02); *H10K 59/80515* (2023.02); *H10K 59/353* (2023.02)

(58) Field of Classification Search
CPC ........... H10K 59/122; H10K 59/80515; H10K 59/353; H10K 2102/351; H10K 59/124; H10K 59/80518; H10K 59/876; H10K 59/878; H10K 59/12; H10K 50/805; H10K 50/84; H10K 59/123; H10K 59/805; H10K 59/87; H10K 59/1213; H10K 59/35; H10K 59/80517; H10K 59/8052
See application file for complete search history.

(56) References Cited

U.S. PATENT DOCUMENTS

| | | | | |
|---|---|---|---|---|
| 11,563,066 | B2 * | 1/2023 | Lee | H10K 59/123 |
| 2015/0102292 | A1 * | 4/2015 | Kim | H10K 59/122 257/40 |
| 2021/0005691 | A1 * | 1/2021 | Lee | H10K 59/123 |
| 2021/0020725 | A1 * | 1/2021 | Park | H10K 59/121 |
| 2021/0200011 | A1 * | 7/2021 | Zhang | G02F 1/133345 |
| 2022/0384536 | A1 | 12/2022 | Kimura et al. | |
| 2024/0099091 | A1 * | 3/2024 | Shin | H10K 59/35 |
| 2024/0389395 | A1 * | 11/2024 | Kim | H10K 59/1213 |
| 2026/0164974 | A1 * | 6/2026 | Shin | H10K 59/32 |

FOREIGN PATENT DOCUMENTS

KR 10-2022-0162055 A 12/2022

* cited by examiner

*Primary Examiner* — J. E. Schoenholtz
(74) *Attorney, Agent, or Firm* — Fenwick & West LLP

(57) ABSTRACT

A display device includes: a substrate with a plurality of pixels on the substrate, the plurality of pixels including light emitting areas; a plurality of transistors in each of the plurality of pixels on the substrate; an overcoating layer on the plurality of transistors; a plurality of first electrodes on the overcoating layer in the plurality of pixels, the plurality of first electrodes connected to each of the plurality of transistors; a bank between the plurality of pixels on the overcoating layer; a light emitting part disposed on the plurality of first electrodes and the bank; and a second electrode disposed on the light emitting part, wherein the overcoating layer includes a concave part between the light emitting areas of the plurality of pixels.

21 Claims, 16 Drawing Sheets

DISPLAY DEVICE

CROSS-REFERENCE TO RELATED APPLICATION

This application claims the priority from Republic of Korea Patent Application No. 10-2023-0075912 filed on Jun. 14, 2023, which is hereby incorporated by reference in its entirety.

FIELD

The present disclosure relates to a display device, and more particularly, to a display device capable of improving reliability and display quality.

BACKGROUND

Unlike a liquid crystal display, an organic light emitting display device does not require a separate light source and can be manufactured in a light and thin form. In addition, the organic light emitting display devices are not only advantageous in terms of power consumption due to low voltage driving, but also have excellent color reproduction, response speed, viewing angle, and contrast ratio (CR), and therefore, are being studied as a next-generation display.

The organic light emitting display device is a self-emitting display device, and is a display device using an organic light emitting diode that injects electrons and holes into a light emitting layer from a cathode for electron injection and an anode for hole injection, respectively, and emits light when an exciton, which is a combination of the injected electron and hole, falls from an excited state to a ground state.

The organic light emitting display devices may be divided into a top emission type, a bottom emission type, a dual emission type, or the like depending on a direction in which light is emitted, and divided into a passive matrix type, an active matrix type, or the like depending on the driving method.

SUMMARY

An object to be achieved by the present disclosure is to provide a display device capable of minimizing or at least reducing a residue of a transparent conductive layer occurring between a plurality of pixels.

Another object to be achieved by the present disclosure is to provide a display device capable of improving an aperture ratio of a light emitting diode.

Still another object to be achieved by the present disclosure is to provide a display device capable of making thicknesses of light emitting parts of a plurality of pixels uniform.

Objects of the present disclosure are not limited to the above-mentioned objects, and other objects, which are not mentioned above, can be clearly understood by those skilled in the art from the following descriptions.

A display device according to an embodiment of the present disclosure includes: a substrate with a plurality of pixels on the substrate, the plurality of pixels including light emitting areas; a plurality of transistors in each of the plurality of pixels on the substrate; an overcoating layer on the plurality of transistors; a plurality of first electrodes on the overcoating layer in the plurality of pixels, the plurality of first electrodes connected to each of the plurality of transistors; a bank between the plurality of pixels on the overcoating layer; a light emitting part on the plurality of first electrodes and the bank; and a second electrode on the light emitting part, wherein the overcoating layer includes a concave part between the light emitting areas of the plurality of pixels.

A display device according to another embodiment of the present disclosure includes: a substrate with a plurality of pixels on the substrate; a plurality of transistors in each of the plurality of pixels on the substrate; an overcoating layer on the plurality of transistors; a plurality of first electrodes on the overcoating layer in the plurality of pixels, the plurality of first electrodes connected to each of the plurality of transistors; a bank that overlaps an area between the plurality of pixels on the overcoating layer; a light emitting part on the plurality of first electrodes and the bank; and a second electrode on the light emitting part, wherein the overcoating layer includes a concave part that overlaps an area between ends of the plurality of first electrodes of each of the plurality of pixels.

Other detailed matters of the embodiments are included in the detailed description and the drawings.

According to the effect of the present disclosure, it is possible to improve the reliability of the display device by minimizing or at least reducing the residue of the transparent conductive layer occurring between the plurality of pixels.

According to the effect of the present disclosure, it is possible to improve the luminous efficiency of the display device by improving the aperture ratio of the light emitting diode.

According to the effect of the present disclosure, it is possible to improve the display quality of the display device by making the thicknesses of the light emitting parts of the plurality of pixels uniform.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
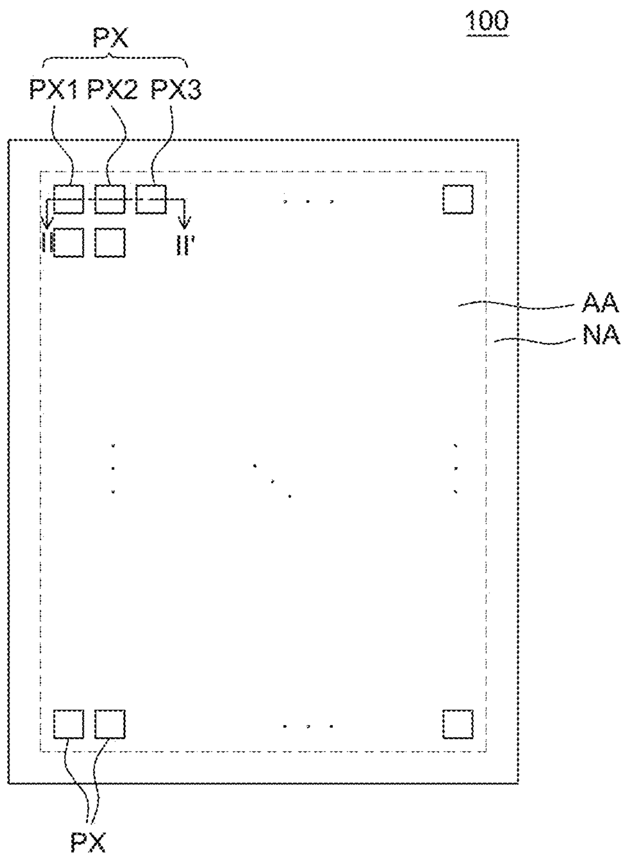
FIG. 1 is a plan view of a display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as 'including', 'having', 'comprising' used herein are generally intended to allow other components to be added unless the terms are used with the term 'only'. Any references to singular may include plural unless expressly stated otherwise.

Components are interpreted to include an ordinary error range even if not expressly stated.

When the position relation between two parts is described using the terms such as 'on', 'above', 'below', 'next', one or more parts may be positioned between the two parts unless the terms are used with the term 'immediately' or 'directly'.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

Figure 2:
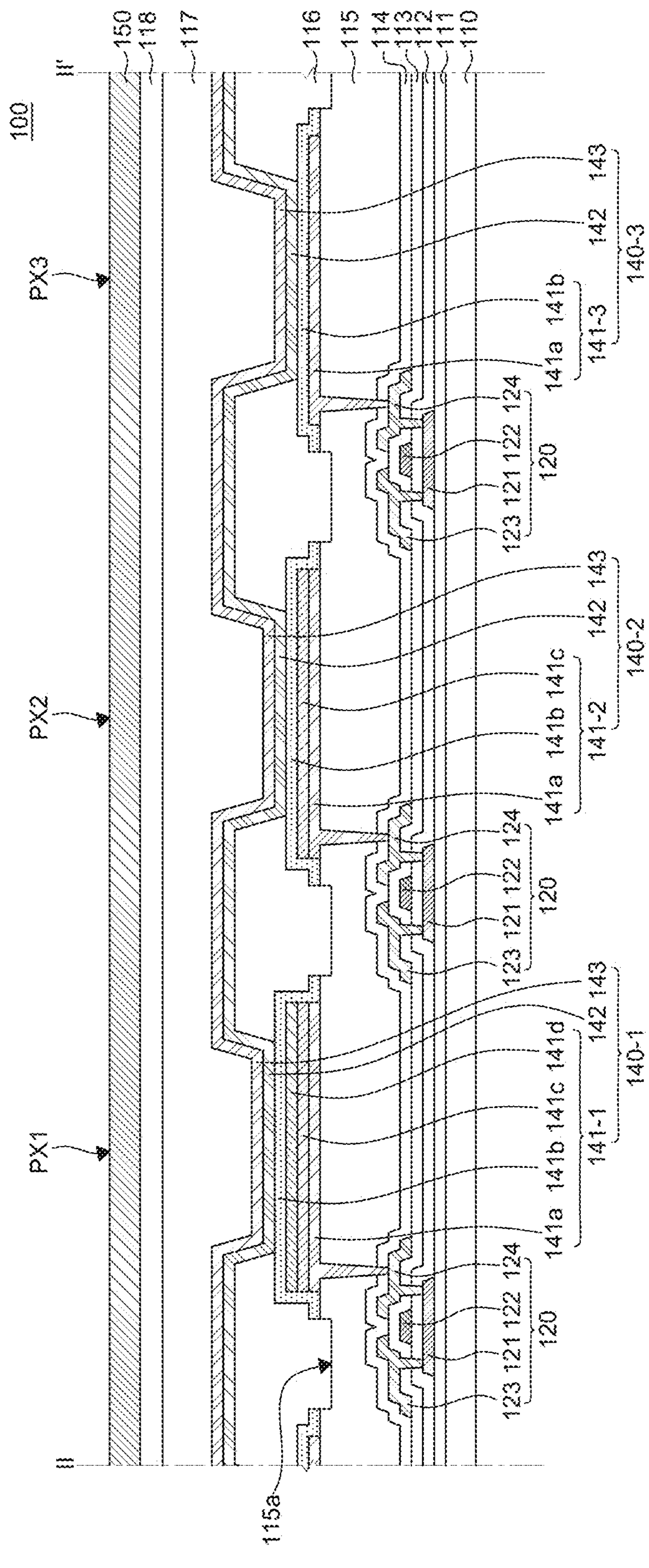
FIG. 2 is a cross-sectional view taken along line II-II' of FIG. 1 according to an embodiment of the present disclosure.

FIG. 1 is a plan view of an organic light emitting display device according to an embodiment of the present disclosure. FIG. 2 is a cross-sectional view taken along line II-II' of FIG. 1 according to an embodiment of the present disclosure.

Referring to FIGS. 1 and 2, a display device 100 includes a lower substrate 110, a transistor 120, an organic light emitting diode 140-1, 140-2 and 140-3 (collectively referred to as organic light emitting diode 140 throughout the disclosure), and an upper substrate 150.

Referring to FIG. 1, the lower substrate 110 is configured to support and protect various components of the display device 100. The lower substrate 110 may be formed of a plastic material with flexibility. In addition, the lower substrate 110 may be formed of an insulating material with transparency. For example, the lower substrate 110 may be formed of transparent polyimide (PI).

The lower substrate 110 includes a display area AA and a non-display area NA.

The display area AA is disposed in a center of the lower substrate 110 and may be an area where an image is displayed in the display device 100. A display element and various driving elements for driving the display element may be disposed in the display area AA. For example, the display element may be composed of an organic light emitting diode 140 including first electrodes 141-1, 141-2, and 141-3, a light emitting part 142, and a second electrode 143. In addition, various driving elements such as transistors, capacitors, and lines for driving the display elements may be disposed in the display area AA.

A plurality of pixels PX may be disposed in the display area AA. The plurality of pixels PX may be an intersection area of a plurality of gate lines disposed in a first direction and a plurality of data lines disposed in a second direction different from the first direction. Here, the first direction may be a horizontal direction of FIG. 1, and the second direction may be a vertical direction of FIG. 1 but are not limited thereto. The plurality of pixels PX may include a plurality of first pixels PX1, a plurality of second pixels PX2, and a plurality of third pixels PX3 that emit light of different colors. For example, the plurality of first pixels PX1 may be a red pixel, the plurality of second pixels PX2 may be a green pixel, and the plurality of third pixels PX3 may be a blue pixel. However, the plurality of pixels PX may further include a fourth pixel, which is a white pixel, but is not limited thereto.

The pixel PX is a minimum unit that constitutes a screen, and each of the plurality of pixels PX may include the organic light emitting diode 140 and the driving element. The driving element may include a switching transistor, a driving transistor, etc. The driving element may be electrically connected to signal lines such as gate lines and data lines connected to a gate driver, a data driver, and the like that are disposed in the non-display area NA.

The non-display area NA is disposed in a surrounding area of the lower substrate 110 and may be an area where an image is not displayed. The non-display area NA may be disposed to surround the display area AA. Various components for driving the plurality of pixels PX disposed in the display area AA may be disposed in the non-display area NA. For example, a driver IC, a driving circuit, a signal line, a flexible film, and the like may be disposed to supply signals for driving the plurality of pixels PX. The driver IC may include a gate driver, a data driver, etc. The driver IC and the driving circuit may be disposed in a gate in panel (GIP) method, a chip on film (COF) method, a tape automated bonding (TAB) method, a tape carrier package (TCP) method, a chip on glass (COG) method, etc.

Hereinafter, the plurality of pixels PX disposed in the display area AA of the display device 100 will be described in more detail with reference to FIG. 2.

Referring to FIG. 2, a buffer layer 111 is disposed on the lower substrate 110. The buffer layer 111 may improve adhesion between layers formed on the buffer layer 111 and the lower substrate 110. In addition, the buffer layer 111 may block alkaline components, etc., from flowing out of the lower substrate 110 and suppress moisture and/or oxygen penetrating from the outside of the lower substrate 110 from diffusing. The buffer layer 111 may be configured by a single layer or multi-layers of silicon nitride (SiNx) or silicon oxide (SiOx) but is not limited thereto. In addition, the buffer layer 111 may be omitted based on the type and material of the lower substrate 110, the structure and type of the transistor 120, etc.

The transistor 120 may be disposed on the buffer layer 111 to drive the organic light emitting diode 140. The transistor 120 may be disposed in each of the plurality of pixels PX in the display area AA. The transistors 120 disposed in each of the plurality of pixels PX may be used as the driving elements of the display device 100. The transistor 120 may be, for example, a thin film transistor (TFT), an N-channel metal oxide semiconductor (NMOS) transistor, a P-channel metal oxide semiconductor (PMOS) transistor, a complementary metal oxide semiconductor (CMOS) transistor, a field effect transistor (FET), etc., but is not limited thereto. Hereinafter, the transistor 120 will be described under the assumption that it is a thin film transistor but is not limited thereto.

The transistor 120 includes an active layer 121, a gate electrode 122, a source electrode 123, and a drain electrode 124. The transistor 120 illustrated in FIG. 2 is a thin film transistor with a top gate structure in which the gate electrode 122 is disposed on the active layer 121. However, the transistor 120 is not limited thereto, and may be implemented as a thin film transistor with a bottom gate structure.

The active layer 121 of the transistor 120 is disposed on the buffer layer 111. The active layer 121 is an area where a channel is formed when the transistor 120 is driven. The active layer 121 may be formed of an oxide semiconductor, amorphous silicon (a-Si), polycrystalline silicon (poly-Si), an organic semiconductor, or the like, but is not limited thereto.

Agate insulating layer 112 is disposed on the active layer 121. The gate insulating layer 112 may be configured by a single layer or a multi-layer of silicon nitride (SiNx) or silicon oxide (SiOx) which is an inorganic material. Contact holes are formed in the gate insulating layer 112 for each of the source electrode 123 and the drain electrode 124 to contact each of the source and drain areas of the active layer 121. The gate insulating layer 112 may be formed over the entire surface of the lower substrate 110 as illustrated in FIG. 2 and may be patterned to have the same width as the gate electrode 122 but is not limited thereto.

The gate electrode 122 is disposed on the gate insulating layer 112. The gate electrode 122 is disposed on the gate insulating layer 112 to overlap the channel area of the active layer 121. The gate electrode 122 may be formed of any one of various metal materials such as molybdenum (Mo), aluminum (Al), chromium (Cr), gold (Au), titanium (Ti), nickel (Ni), neodymium (Nd), and copper (Cu), or an alloy of two or more, or may be configured by a multi-layer thereof, but is not limited thereto.

An interlayer insulating layer 113 is disposed on the gate electrode 122. The interlayer insulating layer 113 may be configured by a single layer or a multi-layer of silicon nitride (SiNx) or silicon oxide (SiOx) which is an inorganic material. The contact holes are formed in the interlayer insulating layer 113 for each of the source electrode 123 and the drain electrode 124 to contact each of the source and drain areas of the active layer 121.

The source electrode 123 and the drain electrode 124 are disposed on the interlayer insulating layer 113. The source electrode 123 and the drain electrode 124 are electrically connected to the active layer 121 through the contact holes in the gate insulating layer 112 and the interlayer insulating layer 113. The source electrode 123 and the drain electrode 124 may be formed of any one of various metal materials such as molybdenum (Mo), aluminum (Al), chromium (Cr), gold (Au), titanium (Ti), nickel (Ni), neodymium (Nd), and copper (Cu), or an alloy of two or more, or may be configured by a multi-layer thereof. However, the present disclosure is not limited thereto.

In FIG. 2, for convenience of description, only the driving transistor among various transistors 120 included in the display device 100 is illustrated, but other transistors such as switching transistors may also be disposed.

Referring to FIG. 2, a passivation layer 114 is disposed on the transistor 120 to protect the transistor 120. A contact hole for exposing the drain electrode 124 of the transistor 120 is formed in the passivation layer 114. FIG. 2 illustrates that a contact hole is formed in the passivation layer 114 to expose the drain electrode 124, but a contact hole may also be formed to expose the source electrode 123. The passivation layer 114 may be configured by a single layer or a multi-layer of silicon nitride (SiNx) or silicon oxide (SiOx). However, the passivation layer 114 may be omitted according to the embodiment of the present disclosure.

An overcoating layer 115 is disposed on the passivation layer 114 to planarize an upper portion of the transistor 120. A contact hole is formed in the overcoating layer 115 to expose the drain electrode 124 of the transistor 120. FIG. 2 illustrates that a contact hole is formed in the overcoating layer 115 to expose the drain electrode 124, but a contact hole may also be formed to expose the source electrode 123. The overcoating layer 115 may be formed of one of an acryl resin, an epoxy resin, a phenol resin, a polyamide resin, a polyimide resin, an unsaturated polyester resin, a polyphenylene resin, a polyphenylene sulfide resin, benzocyclobutene, and photoresist, but is not limited thereto.

The overcoating layer 115 includes a concave part **115*a* disposed between the light emitting areas of the plurality of pixels PX. Referring to FIG. 2, the concave part 115*a* is disposed to overlap an area between ends of first electrodes 141-1, 141-2, and 141-3 of each of the plurality of pixels PX, and a width of the concave part 115*a* is equal to a gap between the ends of the first electrodes 141-1, 141-2, and 141-3 of each of the plurality of pixels PX. For example, the concave part 115*a* may be formed by removing a portion of the overcoating layer 115** between the plurality of pixels PX using a dry etch method but is not limited thereto.

Referring to FIG. 2, the organic light emitting diode 140 is disposed on the overcoating layer 115. The organic light emitting diode 140 includes first electrodes 141-1, 141-2, and 141-3 that are formed on the overcoating layer 115 and electrically connected to the drain electrode 124 of the transistor 120, light emitting parts 142 that are disposed on the first electrodes 141-1, 141-2, and 141-3, and second electrodes 143 formed on the light emitting parts 142. Here, the first electrodes 141-1, 141-2, and 141-3 may be an anode electrode, and the second electrode 143 may be a cathode electrode.

The first electrodes 141-1, 141-2, and 141-3 are disposed on the overcoating layer 115 and are electrically connected to the drain electrode 124 of the transistor 120 through the contact holes formed in the passivation layer 114 and the overcoating layer 115. Accordingly, the organic light emitting diode 140 may be connected to the transistor 120.

FIG. 2 illustrates that the first electrodes 141-1, 141-2, and 141-3 are electrically connected to the drain electrode 124 of the transistor 120 through the contact hole, but the first electrodes 141-1, 141-2, and 141-3 may be configured to be electrically connected to the source electrode 123 of the transistor 120 through the contact hole through the type of the transistor 120, the design method of the driving circuit, etc.

Referring to FIG. 2, the first electrodes 141-1, 141-2, and 141-3 of the plurality of pixels PX include a reflective layer 141*a* and a transparent conductive layer 141*b*, 141*c*, and 141*d*, respectively.

The reflective layer 141*a* is disposed on the overcoating layer 115 and is electrically connected to the drain electrode 124 through the contact hole formed in the passivation layer 114 and the overcoating layer 115. The reflective layer 141*a* is disposed to emit light emitted from the light emitting part 142 to the upper portion of the display device 100. For example, the reflective layer 141*a* may be formed of a reflective metal material but is not limited thereto.

The transparent conductive layers 141*b*, 141*c*, and 141*d* may be formed of a transparent conductive material with a high work function in order to supply holes to the light emitting part 142 and emit light emitted from the light emitting part 142. For example, the first electrodes 141-1, 141-2, and 141-3 may be formed of indium tin oxide (ITO), indium zinc oxide (IZO), indium tin zinc oxide (ITZO), zinc oxide (ZnO), and tin oxide (TO)-based transparent conductive oxides but are not limited thereto.

The first electrode 141-1 of the first pixel PX1 includes a reflective layer 141*a*, a second transparent conductive layer 141*c* on the reflective layer 141*a*, a third transparent conductive layer 141*d* on the second transparent conductive layer 141*c*, and a first transparent conductive layer 141*b* on the third transparent conductive layer 141*d*. The first transparent conductive layer 141*b* of the first electrode 141-1 of the first pixel PX1 is disposed to cover side surfaces of the reflective layer 141*a*, the second transparent conductive layer 141*c*, and the third transparent conductive layer 141*d*.

The first electrode 141-2 of the second pixel PX2 includes the reflective layer 141*a*, the second transparent conductive layer 141*c* on the reflective layer 141*a*, and the first transparent conductive layer 141*b* on the second transparent conductive layer 141*c*. The first transparent conductive layer 141*b* of the first electrode 141-2 of the second pixel PX2 is disposed to cover the side surfaces of the reflective layer 141*a* and the second transparent conductive layer 141*c*.

The first electrode 141-3 of the third pixel PX3 includes the reflective layer 141*a* and the first transparent conductive layer 141*b* on the reflective layer 141*a*. The first transparent conductive layer 141*b* of the first electrode 141-3 of the third pixel PX3 is disposed to cover the side surface of the reflective layer 141*a*.

Referring to FIG. 2, the first electrodes 141-1, 141-2, and 141-3 may have different thicknesses in each of the first pixel PX1, the second pixel PX2, and the third pixel PX3. For example, regarding the thicknesses of the first electrodes 141-1, 141-2, and 141-3, when the first pixel PX1 is a red pixel, the second pixel PX2 is a green pixel, and the third pixel PX3 is a blue pixel, the first electrode 141-1 of the first pixel PX1 may be thicker than the first electrodes 141-2 and 141-3 of the second pixel PX2 and the third pixel PX3, and the first electrode 141-2 of the second pixel PX2 may be thicker than the first electrode 141-3 of the third pixel PX3. Accordingly, the first electrodes 141-1, 141-2, and 141-3 may have a micro-cavity structure that may amplify light of a wavelength corresponding to light emitted from the first pixel PX1, the second pixel PX2, and the third pixel PX3, respectively.

A bank 116 is disposed on the first electrodes 141-1, 141-2, and 141-3 and the overcoating layer 115. The bank 116 may define a light emitting area by covering edges of the first electrodes 141-1, 141-2, and 141-3 of the organic light emitting diode 140. The bank 116 is disposed between adjacent pixels PX to reduce color mixture of light emitted from the organic light emitting diodes 140 of each of the plurality of pixels. The bank 116 may be formed of an organic material. For example, the bank 116 may be formed of a polyimide resin, an acryl resin, or a benzocyclobutene-based resin, but is not limited thereto.

The light emitting part 142 is disposed on the first electrodes 141-1, 141-2, and 141-3 and the bank 116. For example, the light emitting part 142 may be a light emitting layer that emits light of any one color of red, green, and blue. In addition, the light emitting part 142 may further include various layers such as a hole transport layer, a hole injection layer, a hole blocking layer, an electron injection layer, an electron blocking layer, and an electron transport layer, but is not limited thereto.

The second electrode 143 is disposed on the light emitting part 142. The second electrode 143 supplies electrons to the light emitting part 142. The second electrode 143 may be formed of a conductive material with a low work function. The second electrode 143 may be configured to emit the light emitted from the light emitting part 142 to the upper portion of the display device 100. For example, the second electrode 143 may be formed of transparent conductive materials such as indium tin oxide (ITO) or indium zinc oxide (IZO), opaque conductive materials such as titanium (Ti), gold (Au), silver (Ag), copper (Cu), an alloy thereof, or the like, but is not limited thereto.

Meanwhile, although not illustrated in the drawings, an inorganic insulating layer may be further disposed on the second electrode 143 to protect the second electrode 143. For example, the inorganic insulating layer may be configured by a single layer or a multi-layer of silicon nitride (SiNx) or silicon oxide (SiOx) but is not limited thereto.

Referring to FIG. 2, an encapsulation layer 117 is disposed on the organic light emitting diode 140. The encapsulation layer 117 may cover the organic light emitting diode 140. The encapsulation layer 117 may protect the organic light emitting diode 140 from external moisture, oxygen, shock, etc. The encapsulation layer 117 may be formed by alternately stacking a plurality of inorganic layers and a plurality of organic layers. For example, the inorganic layer may be formed of an inorganic material such as silicon nitride (SiNx), silicon oxide (SiOx), or aluminum oxide (AlOx), and the organic layer may be formed of an epoxy-based or acryl-based polymer but are not limited thereto.

The upper substrate 150 is disposed on the encapsulation layer 117. The upper substrate 150 may protect the organic light emitting diode 140 from external moisture, oxygen, shock, etc., along with the encapsulation layer 117. For example, the upper substrate 150 may be formed of a transparent insulating material, and the display device 100 may be configured as the display device 100 of the top emission type but is not limited thereto.

Referring to FIG. 2, an adhesive member 118 is disposed between the encapsulation layer 117 and the upper substrate 150. The adhesive member 118 may adhere the encapsulation layer 117 and the upper substrate 150. The adhesive member 118 is formed of an adhesive material and may be a heat-curing type or natural-curing type adhesive. For example, the adhesive member 118 may be formed of an optical clear adhesive (OCA), a pressure sensitive adhesive (PSA), etc., but is not limited thereto.

Meanwhile, although not illustrated in FIG. 2, a color filter and a black matrix may be further disposed on the organic light emitting diode 140. The color filter may be disposed in each of the plurality of pixels PX, and the black matrix may be disposed at a boundary of the plurality of pixels PX. Accordingly, the black matrix may separate the plurality of pixels PX and the color filters disposed in each pixel PX, and reduce color mixture between the plurality of pixels PX.

For example, when the light emitted from the light emitting part 142 is white light, the color filter converts the light emitted from the corresponding pixel PX into red light, green light, and blue light, respectively. For example, the color filter disposed in the red pixel may be a red color filter. In addition, the green pixel may include a green color filter, and the blue pixel may include a blue color filter but are not limited thereto.

For example, the black matrix may be formed of chromium (Cr) or another opaque metal film, or may be formed of a resin, but is not limited thereto.

Hereinafter, the process of manufacturing the display device 100 according to an embodiment of the present disclosure will be described in detail with reference to FIGS. 3A to 3H.

FIGS. 3A to 3H are process views illustrating a process of manufacturing a display device according to an embodiment of the present disclosure. For convenience of description, only the display area AA of the display device 100 is illustrated in FIGS. 3A to 3H.

Figure 3A:
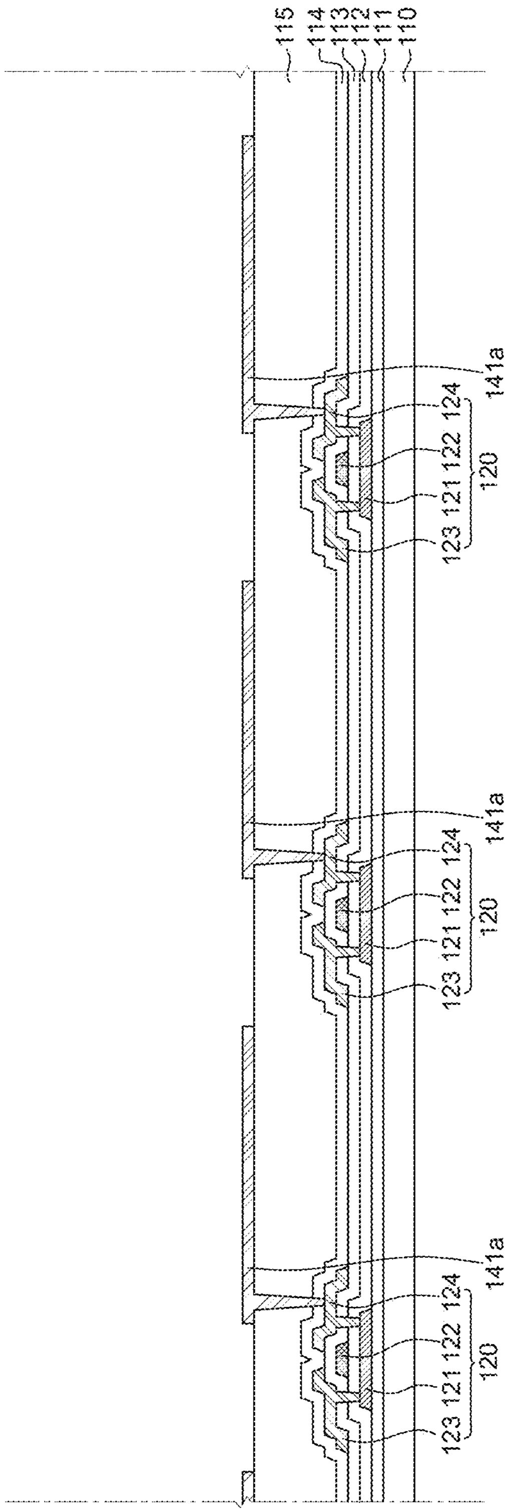
FIGS. 3A to 3H are process views illustrating a process of manufacturing a display device according to an embodiment of the present disclosure.

First, referring to FIG. 3A, the plurality of transistors 120 are disposed in each of the plurality of pixels PX in the display area AA on the lower substrate 110. The passivation layer 114 for protecting the transistor 120 and the overcoating layer 115 for planarizing the upper portion of the transistor 120 are disposed on the plurality of transistors 120. The contact hole is formed in the passivation layer 114 and the overcoating layer 115 to expose a portion of the drain electrode 124 of the transistor 120, and the reflective layers **141*a* of the first electrodes 141-1, 141-2, and 141-3 of the plurality of organic light emitting diodes 140 are disposed to be connected to each of the plurality of transistors 120**.

Figure 3B:
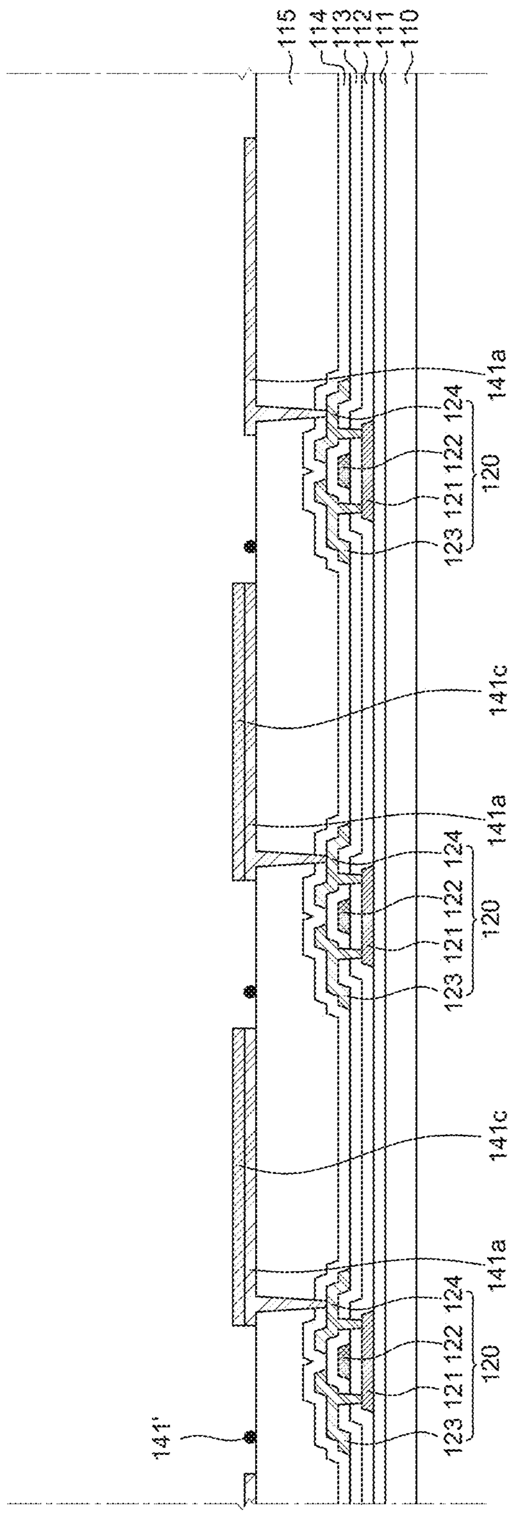

Next, referring to FIG. 3B, the second transparent conductive layer **141*c* is disposed on the reflective layers 141*a* of the first pixel PX1 and the second pixel PX2. The second transparent conductive layer 141*c* may be formed by, for example, a wet etch method. Meanwhile, referring to FIG. 3B, in the process of disposing the second transparent conductive layer 141*c* between the plurality of pixels PX, a residue 141' of the material forming the second transparent conductive layer 141*c*** may occur.

Figure 3C:
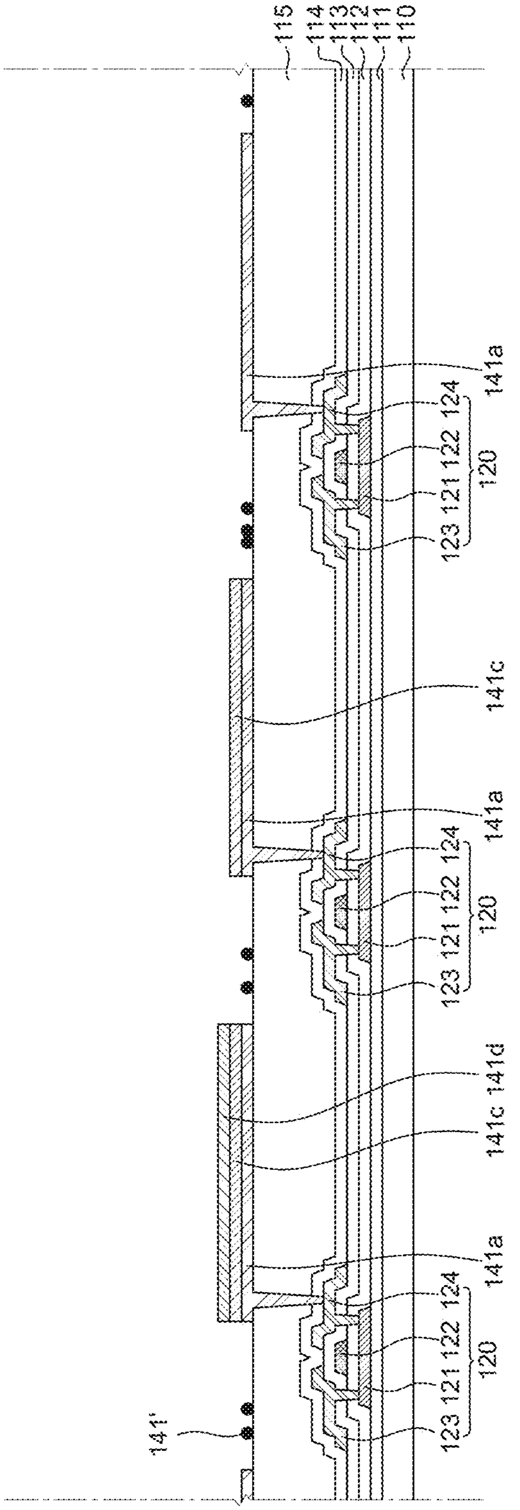

Referring to FIG. 3C, the third transparent conductive layer **141*d* is disposed on the second transparent conductive layer 141*c* of the first pixel PX1. The third transparent conductive layer 141*d* may be formed by, for example, the wet etch method. In this case, referring to FIG. 3C, in the process of disposing the third transparent conductive layer 141*d* between the plurality of pixels PX, the residue 141' of the material forming the third transparent conductive layer 141*d*** may occur.

Figure 3D:
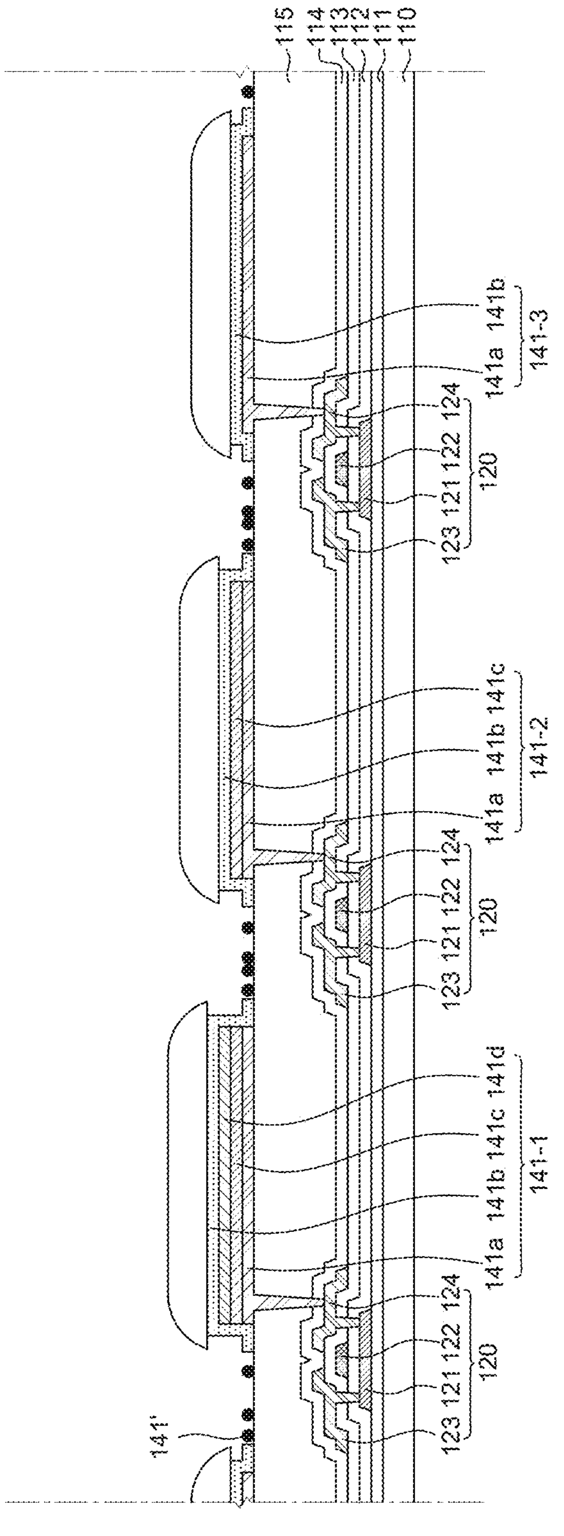

Next, referring to FIG. 3D, the first transparent conductive layer **141*b* is disposed on the third transparent conductive layer 141*d* of the first pixel PX1, the second transparent conductive layer 141*c* of the second pixel PX2, and the reflective layer 141*a* of the third pixel PX3. The first transparent conductive layer 141*b* may be formed by, for example, the wet etch method. Referring to FIG. 3D, in the process of disposing the first transparent conductive layer 141*b* between the plurality of pixels PX, the residue 141' of the material forming the first transparent conductive layer 141*b*** may occur.

Meanwhile, referring to FIG. 3D, in the process of manufacturing the display device according to an embodiment of the present disclosure, after the process of disposing the first transparent conductive layer **141*b* by the wet etching method, photoresist for patterning the first transparent conductive layer 141*b* may not be removed from the upper portion of the first transparent conductive layer 141*b*. Accordingly, the photoresist above the first transparent conductive layer 141*b* may protect the first transparent conductive layer 141*b*** from external materials during the subsequent process but is not limited thereto.

Figure 3E:
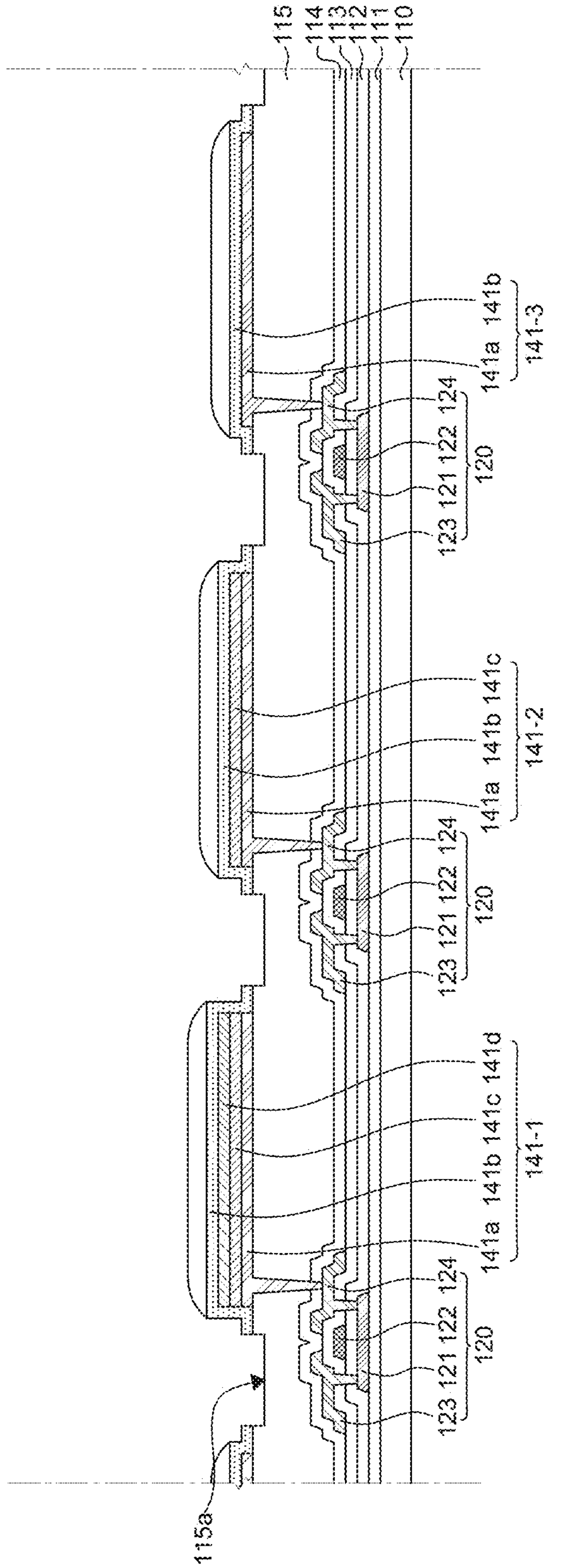

Next, referring to FIG. 3E, a portion of the overcoating layer 115 between the plurality of pixels PX is removed to form the concave part **115*a*. For example, the concave part 115*a* may be formed by removing a portion of the overcoating layer 115 between the plurality of pixels PX using the dry etch method but is not limited thereto. In this case, the concave part 115*a* may be disposed to overlap an area between ends of first electrodes 141-1, 141-2, and 141-3 of each of the plurality of pixels PX, and a width of the concave part 115*a* may be disposed to be equal to a gap between the ends of the first electrodes 141-1, 141-2, and 141-3** of each of the plurality of pixels PX.

Meanwhile, referring to FIG. 3E, in the process of forming the concave part **115*a* in the overcoating layer 115, the residues 141' of the second transparent conductive layer 141*c*, the third transparent conductive layer 141*d*, and the first transparent conductive layer 141*b* occurring between the plurality of pixels PX in the process of disposing the first electrodes 141-1, 141-2, and 141-3 described above may be removed along with a portion of the overcoating layer 115**.

Figure 3F:
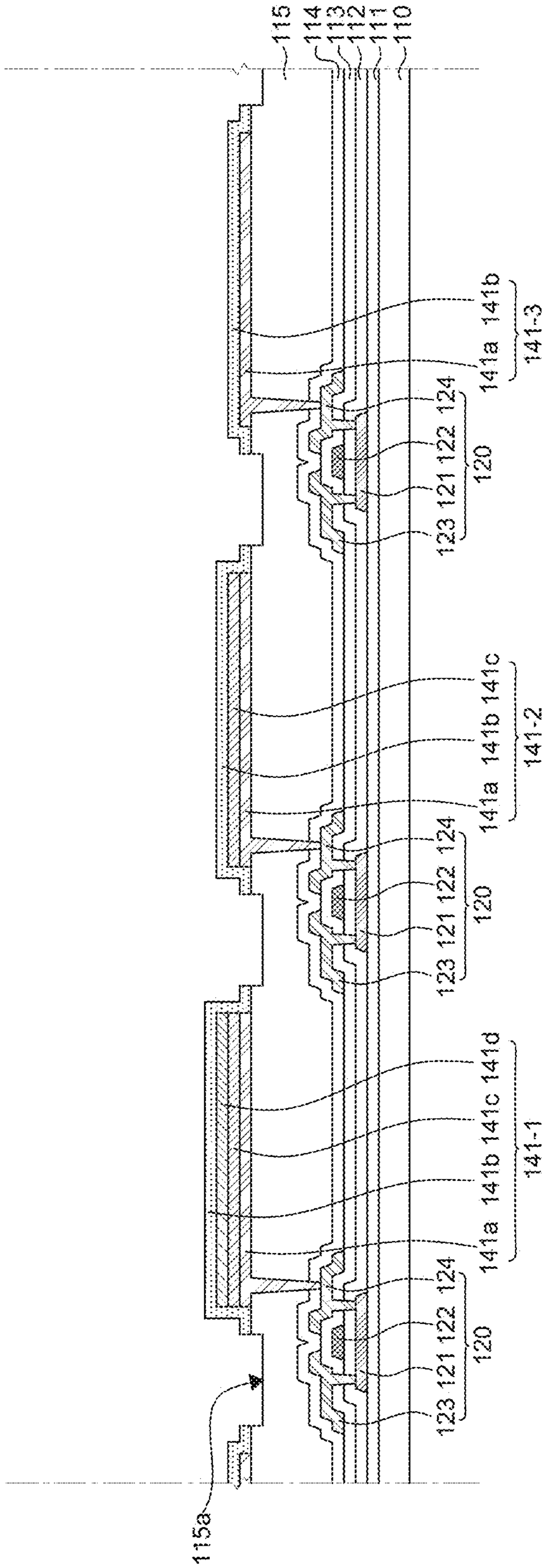

Next, referring to FIG. 3F, the photoresist is removed from the upper portion of the first transparent conductive layer **141*b*. Accordingly, the first electrodes 141-1, 141-2, and 141-3 of the plurality of pixels PX may have different thicknesses. In this case, the process of removing the photoresist from the upper portion of the first transparent conductive layer 141*b*** may be performed, for example, using a PR strip method, but is not limited thereto.

Figure 3G:
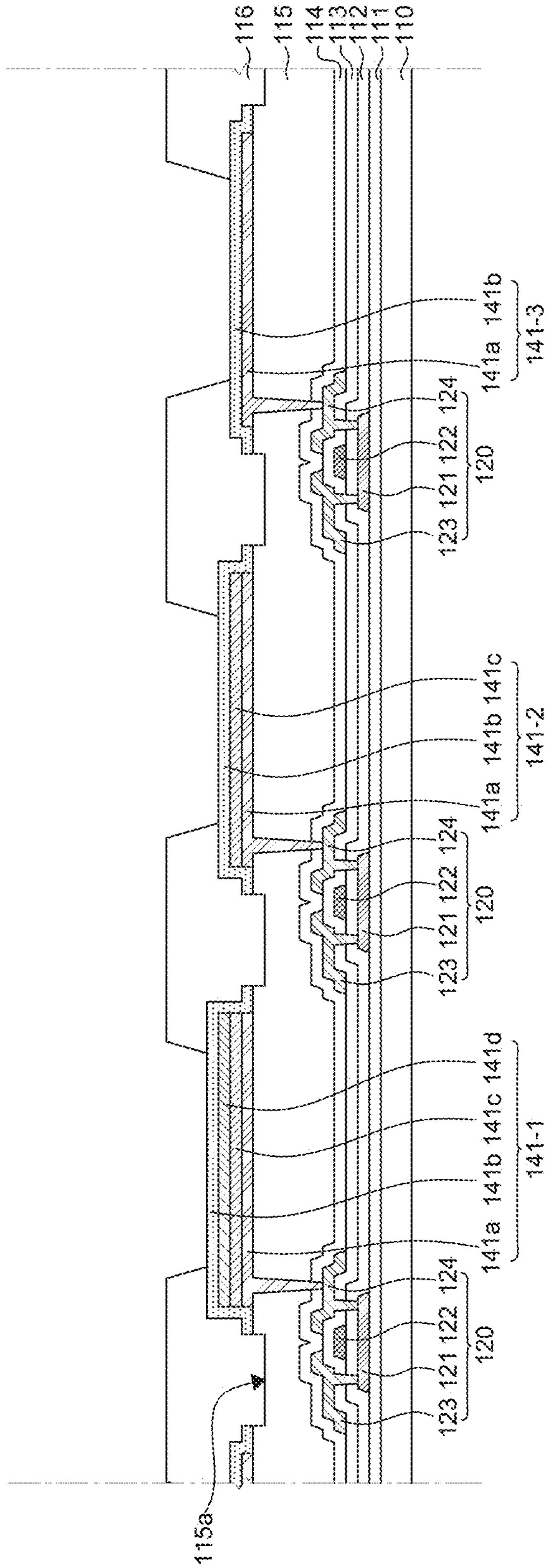

Referring to FIG. 3G, the bank 116 is disposed to cover the edges of the first electrodes 141-1, 141-2, and 141-3 of the plurality of pixels PX. For example, the process of disposing the bank 116 on the first electrodes 141-1, 141-2, and 141-3 of the plurality of pixels PX may be made by a process of patterning and coating a material forming the bank 116 so that the material overlaps the area between the plurality of pixels PX and then curing the material forming the patterned bank 116 but is not limited thereto.

Figure 3H:
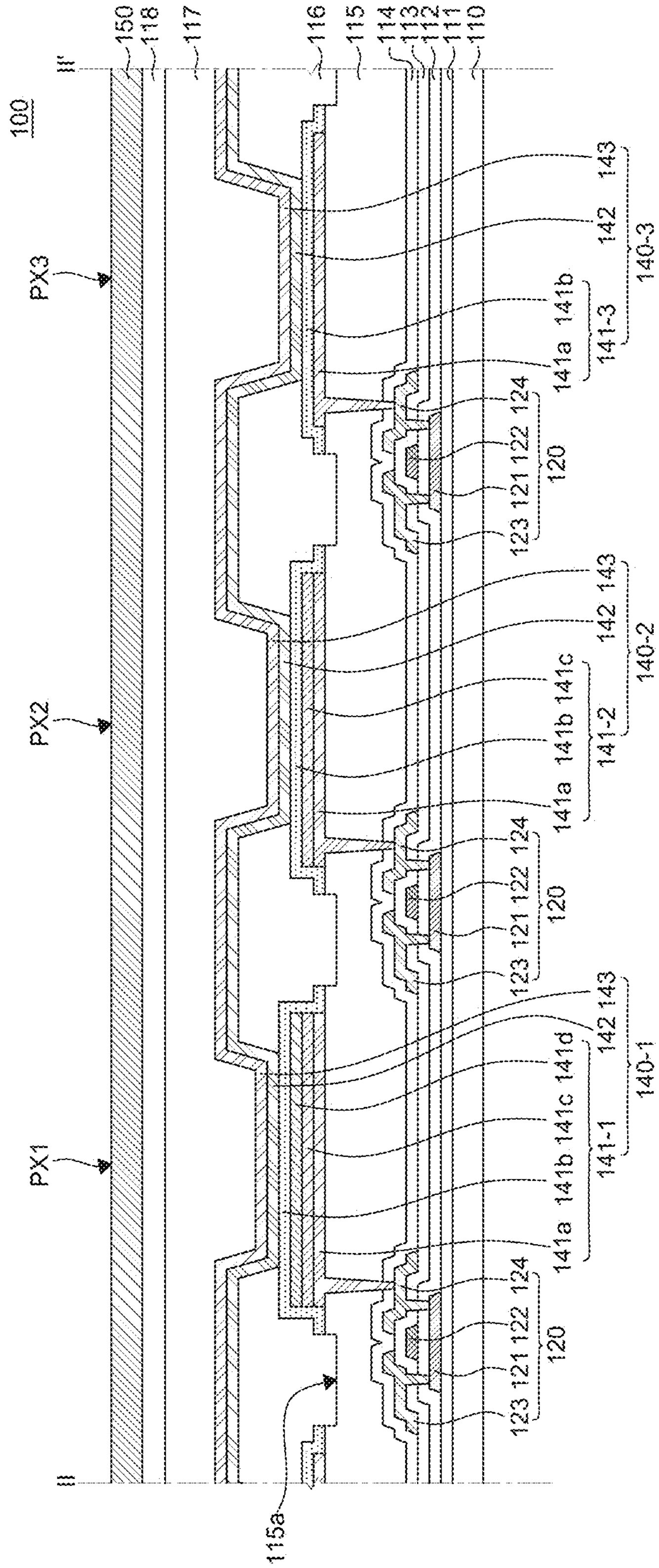

Finally, referring to FIG. 3H, the process of manufacturing the display device 100 may be completed by the process of disposing the light emitting part 142 and the cathode 143 on the first electrodes 141-1, 141-2, and 141-3 of the plurality of pixels PX and the bank 116 to form the organic light emitting diode 140 and disposing the encapsulation layer 117 and the upper substrate 150 above the organic light emitting diode 140.

In order to improve color viewing angle characteristics, the display device may dispose the first electrodes of each of the plurality of pixels emitting different colors to have different thicknesses. Accordingly, each of the plurality of pixels may have the micro-cavity structure corresponding to the light emitted from the corresponding pixel. In the micro-cavity structure, by repeatedly reflecting light between a first electrode and a second electrode that are separated by an optical length, light of a specific wavelength is amplified by constructive interference. Accordingly, the light emitted from each of the plurality of pixels may be amplified and the color viewing angle characteristics of the display device may be improved.

However, in order to dispose the first electrodes of each of the plurality of pixels to have different thicknesses, the process of stacking the transparent conductive layers of the first electrode may be repeated multiple times, and in this process, the residue of the material forming the transparent conductive layer may occur between the plurality of pixels. In addition, when the residues of the transparent conductive layer occur between the plurality of pixels, the residues of the transparent conductive layer may cause lateral leakage current (LLC) defects in which adjacent pixels are lit abnormally when the pixel is lit.

Accordingly, in the display device 100 according to the embodiment of the present disclosure, the overcoating layer 115 between the plurality of pixels PX includes the concave part 115*a*, so it is possible to minimize or at least reduce the residues 141' of the transparent conductive layer between the plurality of pixels PX and minimize or at least reduce the LLC defects of the display device 100.

Specifically, the concave part 115*a* may be disposed to overlap the area between the ends of first electrodes 141-1, 141-2, and 141-3 of each of the plurality of pixels PX, and the width of the concave part 115*a* may be disposed to be equal to the gap between the ends of the first electrodes 141-1, 141-2, and 141-3 of each of the plurality of pixels PX. As the concave part 115*a* is disposed, a portion of the overcoating layer 115 may be removed in the area between the ends of the first electrodes 141-1, 141-2, and 141-3 of each of the plurality of pixels PX in which the residues 141' of the material forming the transparent conductive layer may occur. Accordingly, the residues 141' of the material forming the transparent conductive layer are removed along with a portion of the overcoating layer 115, so it is possible to minimize or at least reduce the residues 141' of the transparent conductive layer between the plurality of pixels PX. Accordingly, in the display device 100 according to the embodiment of the present disclosure, the overcoating layer 115 between the plurality of pixels PX includes the concave part 115*a*, so it is possible to minimize or at least reduce the residues 141' of the transparent conductive layer between the plurality of pixels PX, minimize or at least reduce the LLC defects of the display device 100, and improve the reliability of the display device 100.

Figure 4:
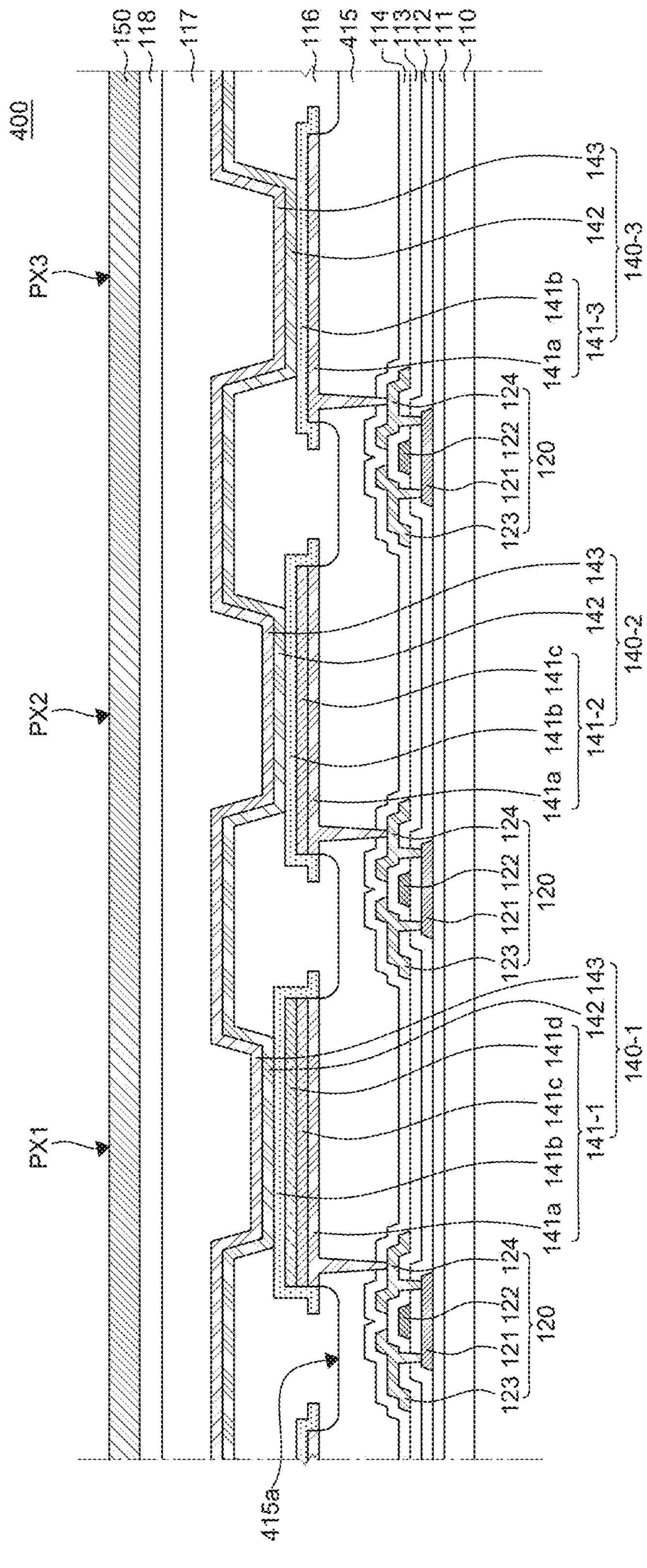
FIG. 4 is a cross-sectional view of a display device according to another embodiment of the present disclosure.

FIG. 4 is a cross-sectional view of a display device according to another embodiment of the present disclosure. A display device 400 of FIG. 4 is different from the display device 100 of FIGS. 1 to 3H only in a concave part 415*a* and other components are substantially the same, and therefore, redundant descriptions thereof will be omitted.

The overcoating layer 415 includes the concave part 415*a* disposed between the light emitting areas of the plurality of pixels PX. Referring to FIG. 4, the concave part 415*a* is disposed to overlap the area between the ends of the first electrodes 141-1, 141-2, and 141-3 of each of the plurality of pixels PX, and the width of the concave part 415*a* is greater than the gap between the ends of the first electrodes 141-1, 141-2, and 141-3 of each of the plurality of pixels PX. Accordingly, the concave part 415*a* of the overcoating layer 415 may expose a portion of the bottom surfaces of the first electrodes 141-1, 141-2, and 141-3.

For example, the concave part 415*a* may be formed by removing a portion of the overcoating layer 415 between the plurality of pixels PX using the dry etch method, and may be formed by an over etching process of allowing the overcoating layer 415 and a portion of the bottom surfaces of the first electrodes 141-1, 141-2, and 141-3 to be spaced apart from each other and the edges of the first electrodes 141-1, 141-2, and 141-3 to have an undercut shape, but is not limited thereto.

In the display device 400 according to another embodiment of the present disclosure, the overcoating layer 415 between the plurality of pixels PX includes the concave part 415*a* that allows the edges of the first electrodes 141-1, 141-2, and 141-3 to have the undercut shape, so it is possible to further minimize or at least reduce the residues 141' of the transparent conductive layer between the plurality of pixels PX and further minimize or at least reduce the LLC defects of the display device 400.

Specifically, the concave part 415*a* may be disposed to overlap the area between the ends of the first electrodes 141-1, 141-2, and 141-3 of each of the plurality of pixels PX, and the width of the concave part 415*a* may be disposed to be greater than the gap between the ends of the first electrodes 141-1, 141-2, and 141-3 of each of the plurality of pixels PX. By the process of disposing the concave part 415*a*, a portion of the overcoating layer 415 may be removed in the area between the ends of the first electrodes 141-1, 141-2, and 141-3 of each of the plurality of pixels PX in which the residues 141' of the material forming the transparent conductive layer may occur. In this case, the residues 141' of the material forming the transparent conductive layer are removed along with a portion of the overcoating layer 415, so it is possible to minimize or at least reduce the residues 141' of the transparent conductive layer between the plurality of pixels PX. Accordingly, in the display device 400 according to the embodiment of the present disclosure, the overcoating layer 415 between the plurality of pixels PX includes the concave part 415*a*, so it is possible to further minimize or at least reduce the residues 141' of the transparent conductive layer between the plurality of pixels PX, further minimize or at least reduce the LLC defects of the display device 400, and further improve the reliability of the display device 400.

Figure 5:
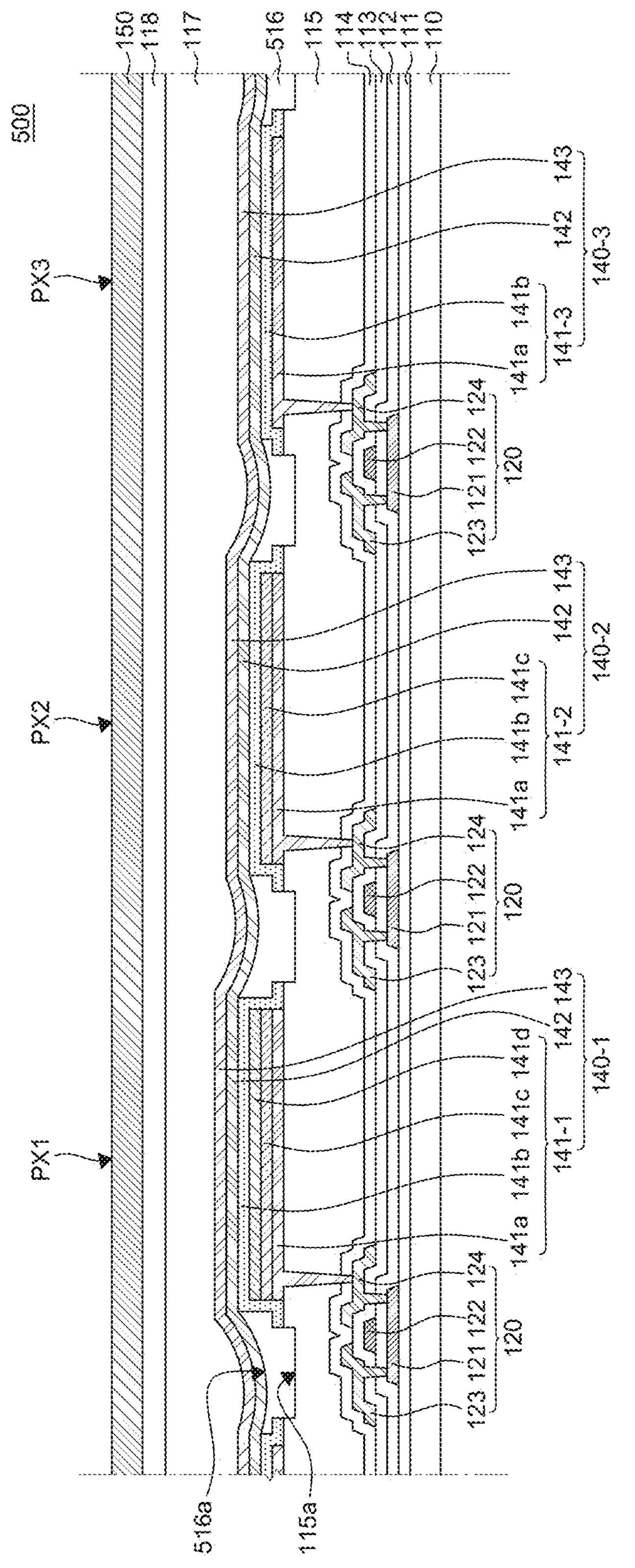
FIG. 5 is a cross-sectional view of a display device according to still another embodiment of the present disclosure.

FIG. 5 is a cross-sectional view of a display device according to still another embodiment of the present disclosure. A display device 500 of FIG. 5 is different from the display device 100 of FIGS. 1 to 3H only in a bank 516 and other components are substantially the same, and therefore, redundant descriptions thereof will be omitted.

Referring to FIG. 5, a top surface 516*a* of the bank 516 extends from the ends of the outermost surfaces of the first electrodes 141-1, 141-2, and 141-3 disposed in one of the plurality of pixels PX to the ends of the outermost surfaces of the first electrodes 141-1, 141-2, and 141-3 disposed in the other pixel PX. Accordingly, the top surface 516*a* of the bank 516 has a concave shape. The entire top surface 516*a* of the bank 516 may have a concave shape. As illustrated in FIG. 5, the top surface 516*a* of the bank 516 may have a concave shape in the entire area between one pixel PX and the other pixel PX. Accordingly, a maximum height of the top surface 516*a* of the bank 516 may be less than or equal to a maximum height of the thickest first electrode 141-1 among the plurality of first electrodes 141-1, 141-2, and 141-3. The maximum height of the top surface 516*a* of the bank 516 is determined based on a plane where the plurality of first electrodes is in contact with the overcoating layer.

In the method of disposing the entire top surface 516*a* of the bank 516 to have the concave shape, for example, the surfaces of the first electrodes 141-1, 141-2, and 141-3 may be formed to have hydrophilicity using interface treatment, and the entire top surface 516*a* of the bank 516 may be formed by the hydrophilicity between the bank 516 formed of organic materials and the surfaces of the first electrodes 141-1, 141-2, and 141-3 to have the concave shape, but the method is not limited thereto.

In the display device 500 according to still another embodiment of the present disclosure, by allowing the entire top surface 516*a* of the bank 516 to have the concave shape, it is possible to improve the aperture ratio of the light emitting diode 140.

Specifically, the top surface 516*a* of the bank 516 is disposed to have the concave shape in the entire area between one pixel PX and the other pixel PX, so the maximum height of the top surface 516*a* of the bank 516 may be disposed to be less than or equal to the maximum height of the thickest first electrode 141-1 among the plurality of first electrodes 141-1, 141-2, and 141-3. Accordingly, the area where the top surfaces of the first electrodes 141-1, 141-2, and 141-3 are exposed from the bank 516, that is, the area of the light emitting area of the organic light emitting diode 140, may increase, so the aperture ratio of the organic light emitting diode 140 may be improved. Accordingly, in the display device 500 according to still another embodiment of the present disclosure, by allowing the entire top surface 516*a* of the bank 516 to have the concave shape, it is possible to improve the aperture ratio of the light emitting diode 140 and improve the luminous efficiency of the display device 500.

Figure 6:
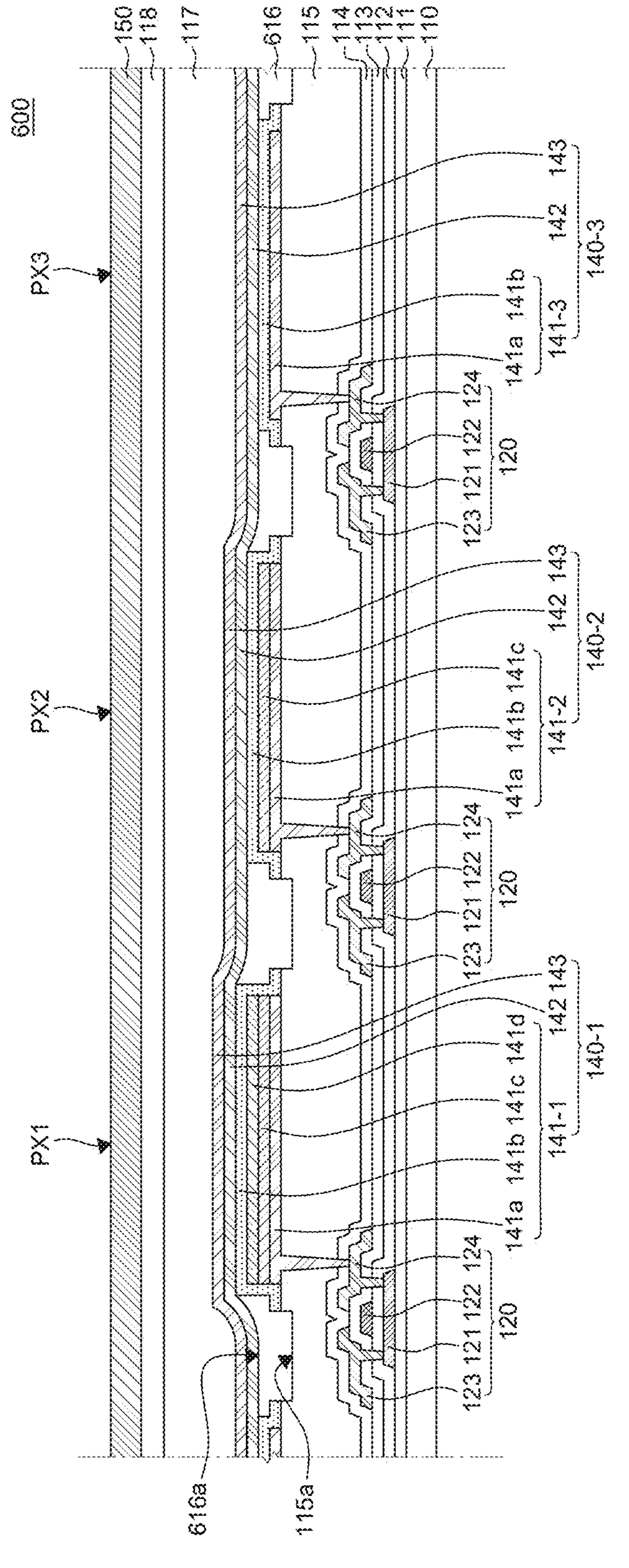
FIG. 6 is a cross-sectional view of a display device according to still another embodiment of the present disclosure.
Figure 7:
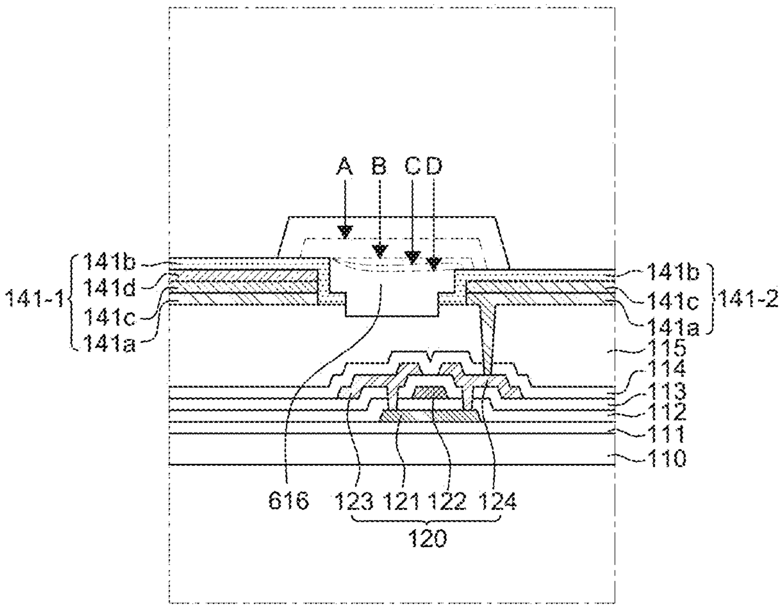
FIG. 7 is a diagram for describing a process of manufacturing a display device according to still another embodiment of the present disclosure.

FIG. 6 is a cross-sectional view of a display device according to still another embodiment of the present disclosure. FIG. 7 is a diagram for describing a process of manufacturing a display device according to still another embodiment of the present disclosure. A display device 600 of FIGS. 6 and 7 is different from the display device 100 of FIGS. 1 to 3H only in a bank 616 and other components are substantially the same, and therefore, redundant descriptions thereof will be omitted. In this case, A and B of FIG. 7 are dotted lines to explain the shape of the top surface 616*a* of the bank 616 at each stage during the process of manufacturing the display device 600 according to still another embodiment of the present disclosure.

Referring to FIG. 6, a top surface 616*a* of the bank 616 extends from the ends of the outermost surfaces of the first electrodes 141-1, 141-2, and 141-3 disposed in one pixel PX of the plurality of pixels PX to the ends of the outermost surfaces of the first electrodes 141-1, 141-2, and 141-3 disposed in the other pixel PX. Accordingly, the top surface 616*a* of the bank 616 has a concave shape. In this case, the top surface 616*a* of the bank 616 has a concave shape in some areas between one pixel PX and the other pixel PX and a flat shape in some other areas. Accordingly, a maximum height of the top surface 616*a* of the bank 616 may be less than or equal to the maximum height of the thickest first electrode 141-1 among the plurality of first electrodes 141-1, 141-2, and 141-3.

Hereinafter, the process in which the top surface 616*a* of the bank 616 has a concave shape in some areas between one pixel PX and the other pixel PX and a flat shape in some other areas will be described in detail with reference to FIG. 7. However, the method in which the top surface 616*a* of the bank 616 has a concave shape in some areas between one pixel PX and the other pixel PX and a flat shape in some other areas is not limited thereto.

Referring to FIG. 7, the bank is formed on the plurality of first electrodes 141-1, 141-2, and 141-3 between the plurality of pixels PX to cover the edges of the plurality of first electrodes 141-1, 141-2, and 141-3.

Then, a portion of the top surface of the bank is ashed to remove the height and width of the bank to a shape similar to an initial shape, as shown in the dotted line A.

Next, the ashing of the bank continues, and the thicker first electrode 141-1 is first exposed between one pixel PX and the other pixel PX. In this case, since the first exposed first electrode 141-1 is not etched due to a difference in selectivity with the material for etching the bank, only the bank may be removed as shown in the dotted line B and dotted line C.

Finally, when the ashing of the bank continues further and the thinner first electrode 141-2 is exposed between one pixel PX and the other pixel PX, the thicker first electrode 141-1 may shield adjacent banks. Accordingly, the top surface 616*a* of the bank 616 may have a concave shape in some areas between one pixel PX and the other pixel PX, and may have the flat shape in some other areas, as shown by the dotted line D.

The light emitting part disposed on the first electrode and the bank of the organic light emitting diode may be formed to cover the edge of the first electrode and may be along the shape of the top surface of the bank disposed in a tapered shape, for example. In this case, due to the inclination of the tapered bank, the light emitting part containing the organic material may locally decrease in thickness and be disposed unevenly. Accordingly, a problem may occur in which the display quality of the display device deteriorates due to a difference in thickness of the light emitting part.

Accordingly, the display device 600 according to still another embodiment of the present disclosure may have the top surface 616*a* of the bank 616 having a concave shape in some areas between one pixel PX and the other pixel PX and a flat shape in some other areas, so it is possible to make the thicknesses of the light emitting parts 142 of the plurality of pixels PX uniform.

Specifically, in the display device 600 according to still another embodiment of the present disclosure, the top surface 616*a* of the bank 616 is disposed to have a concave shape in some areas between one pixel PX and the other pixel PX and have a flat shape in some other areas. Accordingly, the top surface 616*a* of the bank 616 may be disposed to have a curved surface and a flat surface having a smooth shape between the plurality of pixels PX including the first electrodes 141-1, 141-2, and 141-3 having different thicknesses. Accordingly, the thicknesses of the light emitting parts 142 disposed along the top surfaces of the first electrodes 141-1, 141-2, and 141-3 and the bank 616 may be uniform even between the plurality of pixels PX. Accordingly, in the display device 600 according to still another embodiment of the present disclosure, the top surface 616*a* of the bank 616 may have a concave shape in some areas between one pixel PX and the other pixel PX and a flat shape in some other areas, so it is possible to make the thicknesses of the light emitting parts 142 of the plurality of pixels PX uniform and improve the display quality of the display device 600.

Figure 8:
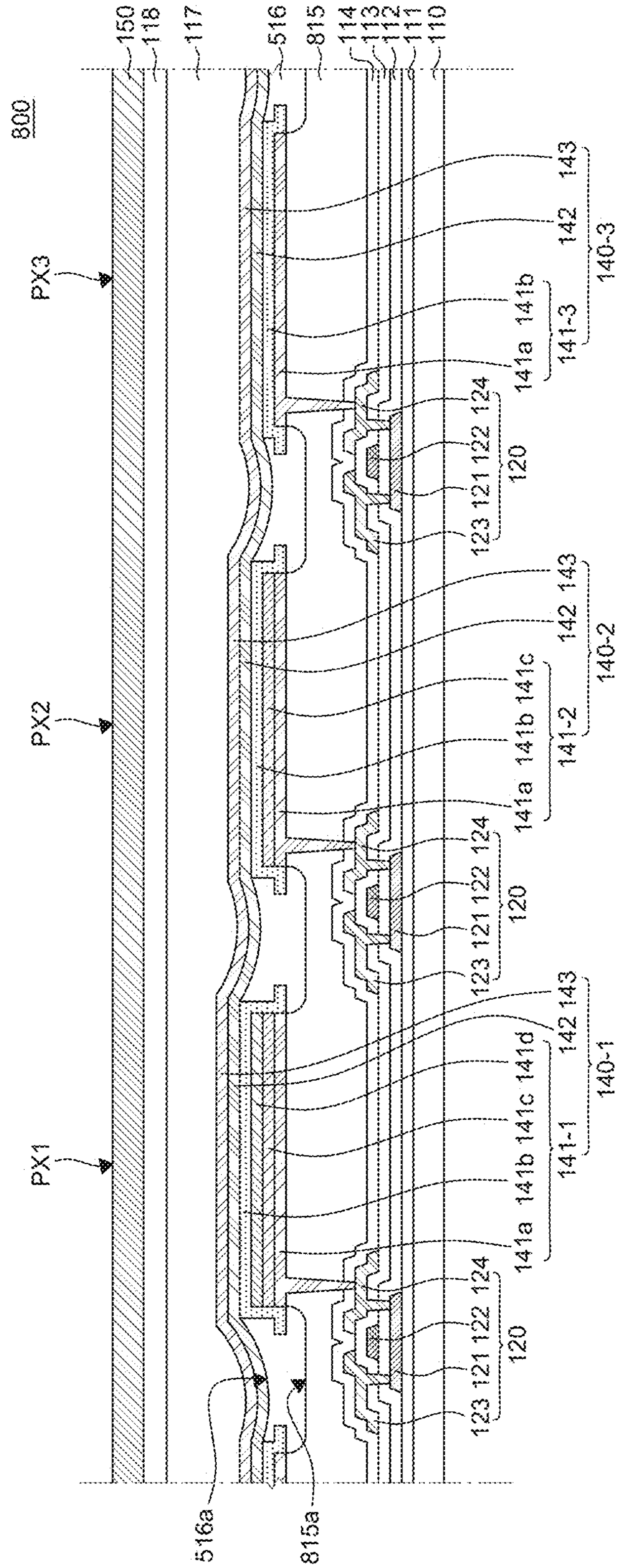
FIG. 8 is a cross-sectional view of a display device according to still exemplary embodiment of the present disclosure.

FIG. 8 is a cross-sectional view of a display device according to still another embodiment of the present disclosure. A display device 800 of FIG. 8 is different from the display device 500 of FIG. 5 only in a concave part 815*a* and other components are substantially the same, and therefore, redundant descriptions thereof will be omitted.

Referring to FIG. 8, the top surface 516*a* of the bank 516 extends from the ends of the outermost surfaces of the first electrodes 141-1, 141-2, and 141-3 disposed in one pixel PX of the plurality of pixels PX to the ends of the outermost surfaces of the first electrodes 141-1, 141-2, and 141-3 disposed in the other pixel PX. Accordingly, the top surface 516*a* of the bank 516 has a concave shape. The entire top surface 516*a* of the bank 516 may have a concave shape. As illustrated in FIG. 8, the top surface 516*a* of the bank 516 may have a concave shape in the entire area between one pixel PX and the other pixel PX. Accordingly, a maximum height of the top surface 516*a* of the bank 516 may be less than or equal to a maximum height of the thickest first electrode 141-1 among the plurality of first electrodes 141-1, 141-2, and 141-3.

In the display device 800 according to still another embodiment of the present disclosure, by allowing the entire top surface 516*a* of the bank 516 to have the concave shape, it is possible to improve the aperture ratio of the light emitting diode 140.

Specifically, the top surface 516*a* of the bank 516 is disposed to have the concave shape in the entire area between one pixel PX and the other pixel PX, so the maximum height of the top surface 516*a* of the bank 516 may be disposed to be less than or equal to the maximum height of the thickest first electrode 141-1 among the plurality of first electrodes 141-1, 141-2, and 141-3. Accordingly, the area where the top surfaces of the first electrodes 141-1, 141-2, and 141-3 are exposed from the bank 516, that is, the area of the light emitting area of the organic light emitting diode 140, may increase, so the aperture ratio of the organic light emitting diode 140 may be improved. Accordingly, in the display device 800 according to still another embodiment of the present disclosure, by allowing the entire top surface 516*a* of the bank 516 to have the concave shape, it is possible to improve the aperture ratio of the light emitting diode 140 and improve the luminous efficiency of the display device 800.

Referring to FIG. 8, the overcoating layer 815 includes the concave part 815*a* disposed between the light emitting areas of the plurality of pixels PX. Referring to FIG. 8, the concave part 815*a* is disposed to overlap the area between the ends of the first electrodes 141-1, 141-2, and 141-3 of each of the plurality of pixels PX, and the width of the concave part 815*a* is greater than the gap between the ends of the first electrodes 141-1, 141-2, and 141-3 of each of the plurality of pixels PX. Accordingly, the concave part 815*a* of the overcoating layer 815 may expose a portion of the bottom surfaces of the first electrodes 141-1, 141-2, and 141-3.

In the display device 800 according to still another embodiment of the present disclosure, the overcoating layer 815 includes the concave part 815*a* disposed between the plurality of pixels PX that allows the edges of the first electrodes 141-1, 141-2, and 141-3 to have the undercut shape, so it is possible to further minimize the residues 141' of the transparent conductive layer between the plurality of pixels PX and further minimize the LLC defects of the display device 800.

Specifically, the concave part 815*a* may be disposed to overlap the area between the ends of the first electrodes 141-1, 141-2, and 141-3 of each of the plurality of pixels PX, and the width of the concave part 815*a* may be disposed to be greater than the gap between the ends of the first electrodes 141-1, 141-2, and 141-3 of each of the plurality of pixels PX. By the process of disposing the concave part 815*a*, a portion of the overcoating layer 815 may be removed in the area between the ends of the first electrodes 141-1, 141-2, and 141-3 of each of the plurality of pixels PX in which the residues 141' of the material forming the transparent conductive layer may occur. In this case, the residues 141' of the material forming the transparent conductive layer are removed along with a portion of the overcoating layer 815, so it is possible to minimize the residues 141' of the transparent conductive layer between the plurality of pixels PX. Accordingly, in the display device 800 according to still another embodiment of the present disclosure, the overcoating layer 815 between the plurality of pixels PX includes the concave part 815*a*, so it is possible to further minimize or at least reduce the residues 141' of the transparent conductive layer between the plurality of pixels PX, further minimize the LLC defects of the display device 800, and further improve the reliability of the display device 800.

Figure 9:
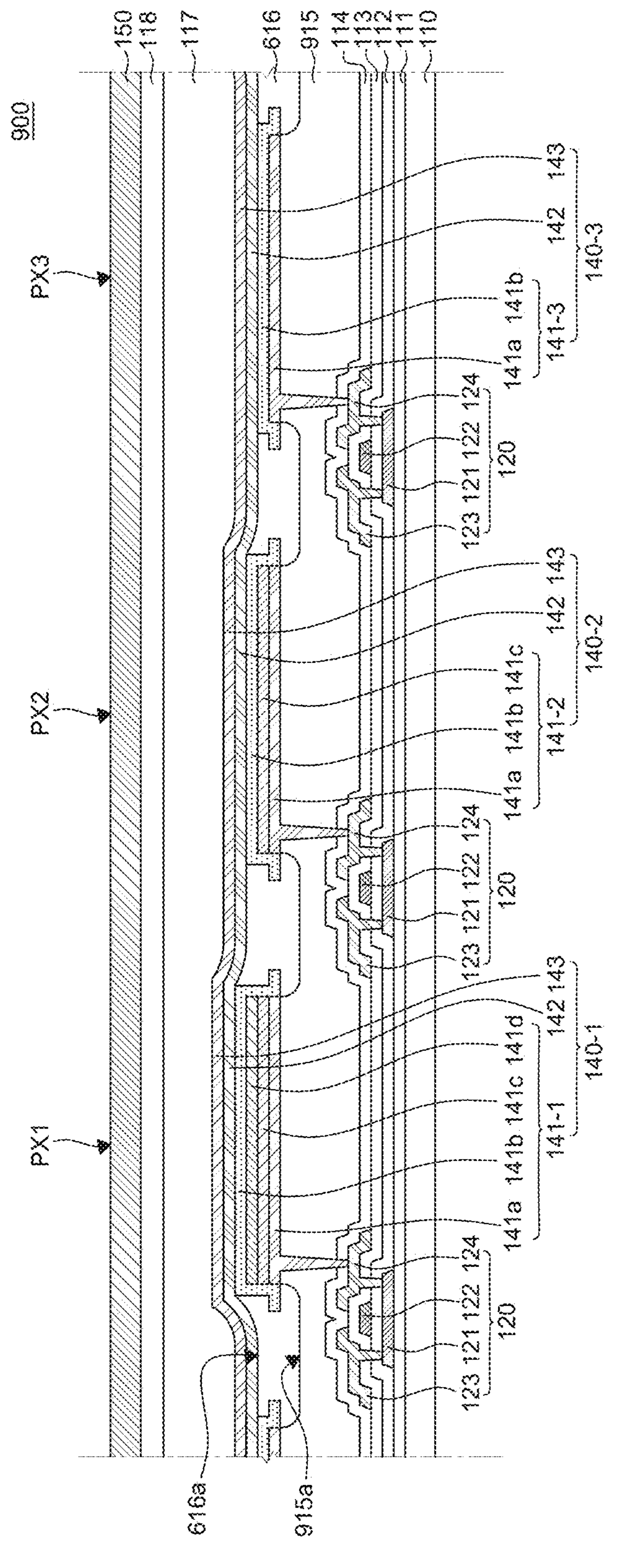
FIG. 9 is a cross-sectional view of a display device according to still another embodiment of the present disclosure.

FIG. 9 is a cross-sectional view of a display device according to still another embodiment of the present disclosure. The display device 900 of FIG. 9 is different from the display device 600 of FIGS. 6 and 7 only in a concave part 915*a* and other components are substantially the same, and therefore, redundant descriptions thereof will be omitted.

Referring to FIG. 9, the top surface 616*a* of the bank 616 extends from the ends of the outermost surfaces of the first electrodes 141-1, 141-2, and 141-3 disposed in one pixel PX of the plurality of pixels PX to the ends of the outermost surfaces of the first electrodes 141-1, 141-2, and 141-3 disposed in the other pixel PX. Accordingly, the top surface 616*a* of the bank 616 has a concave shape. In this case, the top surface 616*a* of the bank 616 has a concave shape in some areas between one pixel PX and the other pixel PX and a flat shape in some other areas. Accordingly, a maximum height of the top surface 616*a* of the bank 616 may be less than or equal to a maximum height of the thickest first electrode 141-1 among the plurality of first electrodes 141-1, 141-2, and 141-3.

Accordingly, in the display device 900 according to still another embodiment of the present disclosure, the top surface 616*a* of the bank 616 may have a concave shape in some areas between one pixel PX and the other pixel PX and a flat shape in some other areas, so it is possible to make the thicknesses of the light emitting parts 142 of the plurality of pixels PX uniform.

Specifically, in the display device 900 according to still another embodiment of the present disclosure, the top surface 616*a* of the bank 616 is disposed to have a concave shape in some areas between one pixel PX and the other pixel PX and have a flat shape in some other areas. Accordingly, the top surface 616*a* of the bank 616 may be disposed to have a curved surface and a flat surface having a smooth shape between the plurality of pixels PX including the first electrodes 141-1, 141-2, and 141-3 having different thicknesses. Accordingly, the thicknesses of the light emitting parts 142 disposed along the top surfaces of the first electrodes 141-1, 141-2, and 141-3 and the bank 616 may be uniform even between the plurality of pixels PX. Accordingly, in the display device 900 according to still another embodiment of the present disclosure, the top surface 616*a* of the bank 616 may have a concave shape in some areas between one pixel PX and the other pixel PX and a flat shape in some other areas, so it is possible to make the thicknesses of the light emitting parts 142 of the plurality of pixels PX uniform and improve the display quality of the display device 900.

Meanwhile, referring to FIG. 9, an overcoating layer 915 includes the concave part 915*a* disposed between the light emitting areas of the plurality of pixels PX. Referring to FIG. 9, the concave part 915*a* is disposed to overlap the area between the ends of the first electrodes 141-1, 141-2, and 141-3 of each of the plurality of pixels PX, and the width of the concave part 915*a* is greater than the gap between the ends of the first electrodes 141-1, 141-2, and 141-3 of each of the plurality of pixels PX. Accordingly, the concave part 915*a* of the overcoating layer 915 may expose a portion of the bottom surfaces of the first electrodes 141-1, 141-2, and 141-3.

In the display device 900 according to still another embodiment of the present disclosure, the overcoating layer 915 disposed between the plurality of pixels PX includes the concave part 915*a* that allows the edges of the first electrodes 141-1, 141-2, and 141-3 to have the undercut shape, so it is possible to further minimize the residues 141' of the transparent conductive layer between the plurality of pixels PX and further minimize the LLC defects of the display device 900.

Specifically, the concave part 915*a* may be disposed to overlap the area between the ends of the first electrodes 141-1, 141-2, and 141-3 of each of the plurality of pixels PX, and the width of the concave part 915*a* may be disposed to be greater than the gap between the ends of the first electrodes 141-1, 141-2, and 141-3 of each of the plurality of pixels PX. By the process of disposing the concave part 915*a*, a portion of the overcoating layer 915 may be removed in the area between the ends of the first electrodes 141-1, 141-2, and 141-3 of each of the plurality of pixels PX in which the residues 141' of the material forming the transparent conductive layer may occur. In this case, the residues 141' of the material forming the transparent conductive layer are removed along with a portion of the overcoating layer 915, so it is possible to minimize the residues 141' of the transparent conductive layer between the plurality of pixels PX. Accordingly, in the display device 900 according to still another embodiment of the present disclosure, the overcoating layer 915 between the plurality of pixels PX includes the concave part 915*a*, so it is possible to further minimize the residues 141' of the transparent conductive layer between the plurality of pixels PX, further minimize the LLC defects of the display device 900, and further improve the reliability of the display device 900.

The embodiments of the present disclosure can also be described as follows:

According to an embodiment of the present disclosure, a display device may comprise a substrate on which a plurality of pixels including light emitting areas is disposed; a plurality of transistors disposed in each of the plurality of pixels on the substrate; an overcoating layer disposed on the plurality of transistors; a plurality of first electrodes disposed on the overcoating layer in the plurality of pixels and connected to each of the plurality of transistors; a bank disposed between the plurality of pixels on the overcoating layer; a light emitting part disposed on the plurality of first electrodes and the bank; and a second electrode disposed on the light emitting part.

The overcoating layer may include a concave part disposed between the light emitting areas of the plurality of pixels.

A width of the concave part may be equal to a gap between ends of the first electrodes of each of the plurality of pixels.

A width of the concave part may be greater than a gap between ends of the first electrodes of each of the plurality of pixels.

The concave part of the overcoating layer may expose a portion of a bottom surface of the first electrode.

A top surface of the bank may extend from an end of an outermost surface of the first electrode disposed in one pixel of the plurality of pixels to the end of the outermost surface of the first electrode disposed in the adjacent other pixel.

The top surface of the bank may have a concave shape.

The top surface of the bank may have the concave shape in an entire area between the one pixel and the other pixel.

The top surface of the bank may have a concave shape in some areas between the one pixel and the other pixel, and a flat shape in some other areas.

The some areas may be areas adjacent to a pixel where the first electrode has a thicker thickness among the one pixel and the other pixel.

The some other areas may be areas adjacent to a pixel where the first electrode has a thinner thickness among the one pixel and the other pixel.

A maximum height of the top surface of the bank may be less than or equal to a maximum height of a thickest first electrode among the plurality of first electrodes.

The plurality of pixels may include a first pixel, a second pixel, and a third pixel that emit different colors.

The plurality of first electrodes may have different thicknesses in each of the first pixel, the second pixel, and the third pixel.

The first electrode of the first pixel may be thicker than the first electrodes of the second pixel and the third pixel.

The first electrode of the second pixel may be thicker than the first electrode of the third pixel.

The first electrode of the first pixel may include a reflective layer, a second transparent conductive layer on the reflective layer, a third transparent conductive layer on the second transparent conductive layer, and a first transparent conductive layer on the third transparent conductive layer.

The first electrode of the second pixel may include the reflective layer, the second transparent conductive layer on the reflective layer, and the first transparent conductive layer on the second transparent conductive layer.

The first electrode of the third pixel may include the reflective layer and the first transparent conductive layer on the reflective layer.

The first transparent conductive layer of the first electrode of the first pixel may be disposed to cover side surfaces of the reflective layer, the second transparent conductive layer, and the third transparent conductive layer.

The first transparent conductive layer of the first electrode of the second pixel may be disposed to cover the side surfaces of the reflective layer and the second transparent conductive layer.

The first transparent conductive layer of the first electrode of the third pixel may be disposed to cover the side surface of the reflective layer.

According to another embodiment of the present disclosure, a display device may comprise a substrate on which a plurality of pixels is disposed; a plurality of transistors disposed in each of the plurality of pixels on the substrate; an overcoating layer disposed on the plurality of transistors; a plurality of first electrodes disposed on the overcoating layer in the plurality of pixels and connected to each of the plurality of transistors; a bank disposed to overlap an area between the plurality of pixels on the overcoating layer; a light emitting part disposed on the plurality of first electrodes and the bank; and a second electrode disposed on the light emitting part.

The overcoating layer may include a concave part disposed to overlap an area between ends of the first electrodes of each of the plurality of pixels.

A width of the concave part may be equal to a gap between the ends of the first electrodes of each of the plurality of pixels.

A width of the concave part may be greater than a gap between the ends of the first electrodes of each of the plurality of pixels.

A top surface of the bank may extend from an end of an outermost surface of the first electrode disposed in one pixel of the plurality of pixels to the end of the outermost surface of the first electrode disposed in the adjacent other pixel.

The entire top surface of the bank may have a concave shape.

The top surface of the bank may have a concave shape in some areas and a flat shape in some other areas.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate with a plurality of pixels on the substrate, the plurality of pixels including light emitting areas;

a plurality of transistors in each of the plurality of pixels on the substrate;

an overcoating layer on the plurality of transistors;

a plurality of first electrodes on the overcoating layer in the plurality of pixels, the plurality of first electrodes connected to each of the plurality of transistors;

a bank between the plurality of pixels on the overcoating layer;

a light emitting part on the plurality of first electrodes and the bank; and a second electrode on the light emitting part, wherein the overcoating layer includes a concave part between the light emitting areas of the plurality of pixels.

2. The display device of claim 1, wherein a width of the concave part is equal to a gap between ends of the plurality of first electrodes of each of the plurality of pixels.

3. The display device of claim 1, wherein a width of the concave part is greater than a gap between ends of the plurality of first electrodes of each of the plurality of pixels.

4. The display device of claim 3, wherein the concave part of the overcoating layer exposes a portion of a bottom surface of a first electrode of the plurality of first electrodes.

5. The display device of claim 1, wherein a top surface of the bank extends from an end of an outermost surface of a first electrode of the plurality of first electrodes in a first pixel of the plurality of pixels to an end of an outermost surface of another first electrode of the plurality of first electrodes in a second pixel of the plurality of pixels that is adjacent to the first pixel.

6. The display device of claim 5, wherein the top surface of the bank has a concave shape.

7. The display device of claim 6, wherein the top surface of the bank has the concave shape in an entire area between the first pixel and the second pixel.

8. The display device of claim 5, wherein the top surface of the bank has a concave shape in first areas between the first pixel and the second pixel, and a flat shape in second areas that are not between the first pixel and the second pixel.

9. The display device of claim 8, wherein:

the first areas are areas adjacent to a pixel where the first electrode has a thicker thickness among the first pixel and the second pixel; and the second areas are areas adjacent to another pixel where the first electrode has a thinner thickness among the first pixel and the second pixel.

10. The display device of claim 5, wherein a maximum height of the top surface of the bank is less than or equal to a maximum height of a thickest first electrode among the plurality of first electrodes.

11. The display device of claim 10, wherein a maximum height of the top surface of the bank is determined based on a plane where the plurality of first electrodes is in contact with the overcoating layer.

12. The display device of claim 1, wherein:

the plurality of pixels includes a first pixel that emits a first color, a second pixel that emits a second color, and a third pixel that emits a third color; and the plurality of first electrodes has different thicknesses in each of the first pixel, the second pixel, and the third pixel.

13. The display device of claim 12, wherein:

a first electrode of the plurality of first electrodes of the first pixel is thicker than first electrodes of the plurality of first electrodes of the second pixel and the third pixel; and a first electrode of the plurality of first electrodes of the second pixel is thicker than a first electrode of the plurality of first electrodes of the third pixel.

14. The display device of claim 12, wherein:

a first electrode of the plurality of first electrodes of the first pixel includes a reflective layer, a second transparent conductive layer on the reflective layer, a third transparent conductive layer on the second transparent conductive layer, and a first transparent conductive layer on the third transparent conductive layer, a first electrode of the plurality of first electrodes of the second pixel includes a reflective layer, a second transparent conductive layer on the reflective layer of the first electrode of the second pixel, and first transparent conductive layer on the second transparent conductive layer of the first electrode of the second pixel; and a first electrode of the plurality of first electrodes of the third pixel includes a reflective layer and a first transparent conductive layer on the reflective layer of the first electrode of the third pixel.

15. The display device of claim 14, wherein:

the first transparent conductive layer of the first electrode of the first pixel covers side surfaces of the reflective layer of the first electrode of the first pixel, the second transparent conductive layer of the first electrode of the first pixel, and the third transparent conductive layer of the first electrode of the first pixel;

the first transparent conductive layer of the first electrode of the second pixel covers side surfaces of the reflective layer of the first electrode of the second pixel and the second transparent conductive layer of the first electrode of the second pixel; and the first transparent conductive layer of the first electrode of the third pixel covers a side surface of the reflective layer of the first electrode of the third pixel.

16. A display device, comprising:

a substrate with a plurality of pixels on the substrate;

a plurality of transistors in each of the plurality of pixels on the substrate;

an overcoating layer on the plurality of transistors;

a plurality of first electrodes on the overcoating layer in the plurality of pixels, the plurality of first electrodes connected to each of the plurality of transistors;

a bank that overlaps an area between the plurality of pixels on the overcoating layer;

a light emitting part on the plurality of first electrodes and the bank; and a second electrode on the light emitting part, wherein the overcoating layer includes a concave part that overlaps an area between ends of the plurality of first electrodes of each of the plurality of pixels.

17. The display device of claim 16, wherein a width of the concave part is equal to a gap between the ends of the plurality of first electrodes of each of the plurality of pixels.

18. The display device of claim 16, wherein a width of the concave part is greater than a gap between the ends of the plurality of first electrodes of each of the plurality of pixels.

19. The display device of claim 16, wherein a top surface of the bank extends from an end of an outermost surface of a first electrode of the plurality of first electrodes in a first pixel of the plurality of pixels to an end of an outermost surface of another first electrode of the plurality of first electrodes in a second pixel adjacent to the first pixel.

20. The display device of claim 19, wherein an entirety of the top surface of the bank has a concave shape.

21. The display device of claim 19, wherein the top surface of the bank has a concave shape in first areas and a flat shape in second areas.

* * * * *